(12) United States Patent
Chen et al.

(10) Patent No.: US 12,248,178 B2
(45) Date of Patent: Mar. 11, 2025

(54) PACKAGED DEVICE INCLUDING AN OPTICAL PATH STRUCTURE ALIGNED TO AN OPTICAL FEATURE

(71) Applicant: Taiwan Semiconductor Manufacturing Co., Ltd., Hsinchu (TW)

(72) Inventors: Hsien-Wei Chen, Hsinchu (TW); Ming-Fa Chen, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/447,560

(22) Filed: Aug. 10, 2023

(65) Prior Publication Data

US 2023/0384521 A1 Nov. 30, 2023

Related U.S. Application Data

(62) Division of application No. 17/075,014, filed on Oct. 20, 2020, now Pat. No. 11,899,242.

(Continued)

(51) Int. Cl.
*G02B 6/13* (2006.01)
*G02B 6/124* (2006.01)
(Continued)

(52) U.S. Cl.
CPC .............. *G02B 6/13* (2013.01); *G02B 6/124* (2013.01); *H01L 21/56* (2013.01); *H01L 23/528* (2013.01); *H01L 24/08* (2013.01); *H01L 24/32* (2013.01); *H01L 24/83* (2013.01);

*G02B 2006/12107* (2013.01); *H01L 23/481* (2013.01); *H01L 2224/08145* (2013.01); (Continued)

(58) Field of Classification Search
CPC ...................... G02B 6/13; G02B 6/124; G02B 2006/12107; G02B 6/34; G02B 6/30; G02B 6/132; G02B 6/136; G02B 6/4274; H01L 2224/73204; H01L 2224/16225; H01L 25/50
See application file for complete search history.

(56) References Cited

U.S. PATENT DOCUMENTS 9,899,355 B2  2/2018 Yuan et al.
9,915,784 B2  3/2018 Budd et al.
(Continued)

FOREIGN PATENT DOCUMENTS

CN  106558577 A  4/2017
CN  107689333 A  2/2018
(Continued)

*Primary Examiner* — Khiem D Nguyen
(74) *Attorney, Agent, or Firm* — Slater Matsil, LLP

(57) ABSTRACT

A packaged device includes an optical IC having an optical feature therein. An interconnect structure including layers of conductive features embedded within respective layers of dielectric materials overlie the optical feature. The interconnect structure is patterned to remove the interconnect structure from over the optical feature and a dielectric material having optically neutral properties, relative to a desired light wavelength(s) is formed over the optical feature. One or more electronic ICs may be bonded to the optical IC to form an integrated package.

20 Claims, 15 Drawing Sheets

Related U.S. Application Data

(60) Provisional application No. 63/001,207, filed on Mar. 27, 2020.

(51) Int. Cl.
  H01L 21/56 (2006.01)
  H01L 23/00 (2006.01)
  H01L 23/528 (2006.01)
  G02B 6/12 (2006.01)
  H01L 23/48 (2006.01)

(52) U.S. Cl.
  CPC ............... *H01L 2224/32145* (2013.01); *H01L 2224/80895* (2013.01); *H01L 2224/83896* (2013.01)

(56) References Cited

U.S. PATENT DOCUMENTS

| | | |
|---|---|---|
| 10,162,139 B1 | 12/2018 | Wang et al. |
| 10,216,059 B2 | 2/2019 | Yu et al. |
| 10,371,893 B2 | 8/2019 | Yu et al. |
| 10,777,430 B2 * | 9/2020 | Yu ....................... H01L 23/3171 |
| 11,417,604 B2 | 8/2022 | Yu et al. |
| 2002/0182851 A1 | 12/2002 | Yeh et al. |
| 2004/0207016 A1 | 10/2004 | Patel et al. |
| 2006/0177173 A1 | 8/2006 | Shastri et al. |
| 2015/0125110 A1 * | 5/2015 | Anderson ............... G02B 6/122 385/14 |
| 2016/0276807 A1 * | 9/2016 | Cai ......................... H01S 5/026 |
| 2016/0306110 A1 | 10/2016 | Lambert |
| 2017/0031094 A1 | 2/2017 | Nakashiba et al. |
| 2017/0285263 A1 * | 10/2017 | Pinguet ................ G02B 6/4208 |
| 2018/0180808 A1 * | 6/2018 | Zhang ................... G02B 6/4274 |
| 2018/0314003 A1 | 11/2018 | Coolbaugh et al. |
| 2019/0004247 A1 * | 1/2019 | Huang .................. G02B 6/4214 |
| 2019/0129098 A1 * | 5/2019 | Chang .................... G02B 6/124 |
| 2019/0146166 A1 | 5/2019 | Wang et al. |
| 2020/0310027 A1 | 10/2020 | Boeuf et al. |
| 2020/0411333 A1 | 12/2020 | Yu et al. |

FOREIGN PATENT DOCUMENTS

| | | |
|---|---|---|
| CN | 109860135 A | 6/2019 |
| DE | 102017124815 A1 | 1/2019 |
| DE | 102020120097 A1 | 7/2021 |
| KR | 102060626 B1 | 12/2019 |
| KR | 20200001473 A | 1/2020 |

* cited by examiner

PACKAGED DEVICE INCLUDING AN OPTICAL PATH STRUCTURE ALIGNED TO AN OPTICAL FEATURE

PRIORITY CLAIM AND CROSS-REFERENCE

This application is a divisional of U.S. application Ser. No. 17/075,014, filed on Oct. 20, 2020, issued as U.S. Pat. No. 11,899,242, which is a conversion of and claims priority to U.S. Provisional Patent Application No. 63/001,207, entitled "SOIC Architecture with Grating Coupling (GC) Opening," and filed on Mar. 27, 2020, which applications are incorporated herein by reference.

BACKGROUND

Photonic integrated circuits (ICs), also referred to as photonic die or photonic chips, or optical integrated circuits or die or chips, transmit, receive, and/or process light signals in much the same way that traditional integrated devices transmit, receive and/or process electrical signals. Because light signals provide advantages in transmission speed and information density, photonic ICs are becoming increasingly desirable in certain applications such as telecommunications, computing, and the like. Other functions, however, are better performed (or at least satisfactorily performed or performed more cheaply) by conventional electronic ICs. It is particularly desirable to incorporate both electronic ICs and photonic ICs into an integrated system including integrated packaging. Such integrated systems and packages, however, give rise to new problems that must be addressed and overcome. The present disclosure provides solutions to one such problem—that of ensuring an adequate light path for the transmission of light signals into, out of, or within an integrated package that includes an optical IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
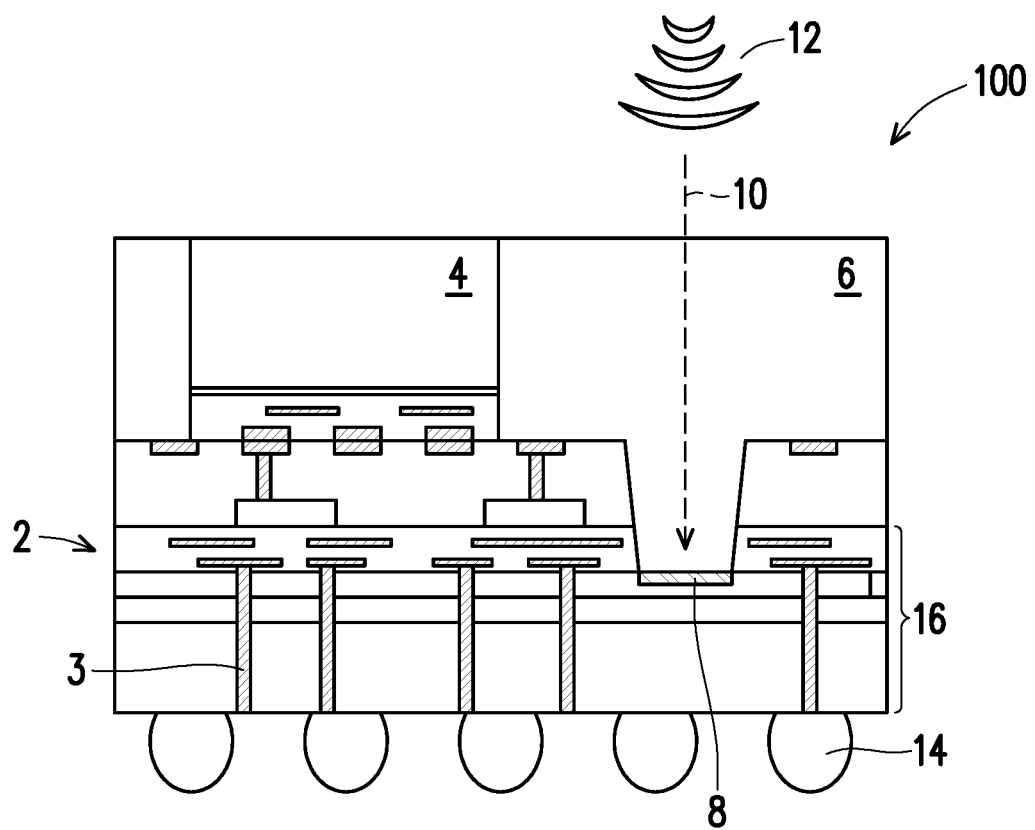
FIG. 1 illustrates a cross-sectional view of a packaged device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an optical IC and an electronic IC can be integrated into a compact package that provides for an optical path to optical features such as grating couplers, waveguides, sensors, and the like, located on the photonic IC. In some embodiments, hybrid bonding is employed to securely bond that photonic and electronic ICs together, although other bonding schemes are within the contemplate scope of this disclosure. 3D-IC packaging techniques may also be advantageously employed, as described herein.

FIG. 1 illustrates a cross-sectional view of an illustrative package device 100, which includes a first chip, such as optical IC2 bonded to a second chip, such as electronic IC 4, both of which are at least partially embedded within a protective dielectric material 6. In an illustrative embodiment, protective dielectric material 6 is an oxide, such as silicon oxide. Other materials could also be employed, as will be discussed in greater detail in the following descriptions of embodiments. FIG. 1 illustrates only those features of device 100 necessary to understand relevant aspects of the present disclosure. One skilled in the art will recognize that device 100 could include numerous other features, including two or more photonic ICs packaged together, two or more electronic ICs packaged together, encapsulant materials such as molding materials, polymers, or the like encapsulating the ICs, fan-out circuitry, interposer boards, coreless interposers, or the like providing for additional electrical connection between the ICs and to external ICs or circuits, additional substrates such as a printed circuit board or the like upon which the ICs may be supported, external electrical connectors (in addition to connectors 14 shown in FIG. 1), and the like. Connectors 14 on the back side of substrate 16 may, in some embodiments, be connected to components on the front side of substrate 16 by way of through substrate vias (TSVs) 3 that extend through the substrate for electrical connection.

A photonic feature, sometimes referred to herein as an optical feature 8 is provided on optical IC2 and is aligned with an optical path 10 indicated by dotted line in FIG. 1, so that light from light source 12 impinges upon optical feature 8 (in other embodiments wherein optical feature 8 transmits light, light source 12 could be a light receiver and light traversing light path 10 would proceed in the other direction; in yet other embodiments, both optical feature 8 and light source 12 are transceivers in which case light path 10 would be bi-directional). Optical feature 8 may be a grating coupler, a waveguide, an optical sensor, or other feature that receives, transmits, processes, or otherwise responds to light energy and/or a light signal. For efficiency and performance, optical path 10 should introduce as little distortion (e.g., reflection, refraction, or the like) into the light signal as possible. It should be noted that the terms optical IC and electronic IC as used herein are not intended to state or imply that the respective ICs have only and exclusively photonic functions or electronic functions. Rather, it is contemplated that an electronic IC 4 may in some embodiments include one or more photonic/optical components and functions and optical IC2 may likewise include one or more electronic components and functions. For convenience, the term optical IC is used to describe that IC (or wafer, board, or similar component) for which an unobstructed optical path will be provided, as opposed to the term electronic IC which is used to describe another IC (regardless of its primary function and mode of operation) that is integrally packaged along with the photonic IC.

Figure 2A:
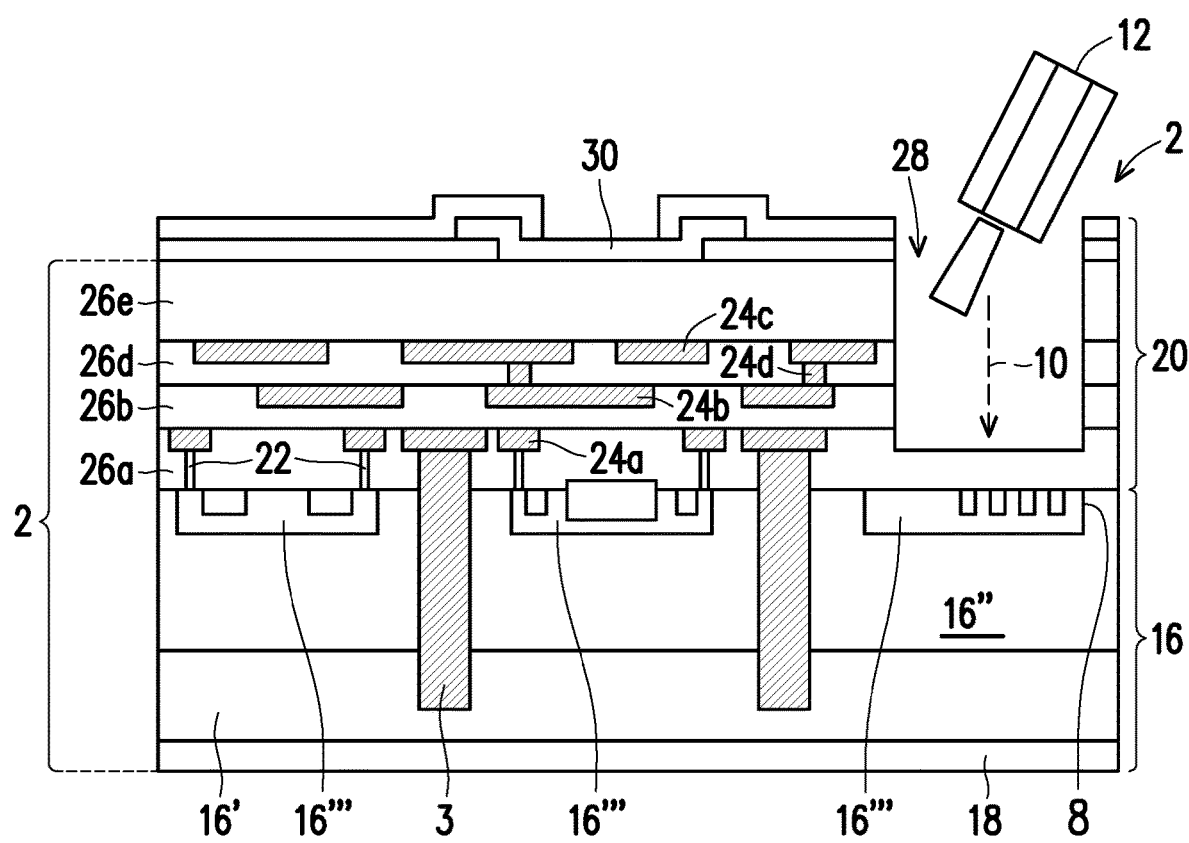
FIGS. 2A through 2C and 3A through 3B illustrate in cross-sectional views illustrative photonic ICs used in accordance with some embodiments.

FIG. 2A illustrates in cross-section view an illustrative optical IC2 in greater detail. In this embodiment, optical feature 8 is embodied as an optical gradient coupler, sometimes referred to herein as a grating coupling or a GC. When referring to optical coupler 8 herein it should be understood that any other optical feature could be used in place of the disclosed optical coupler, unless the context of the disclosure dictates otherwise. It should be apparent to a practitioner in the art that optical IC2 is illustrated in FIG. 2A at an intermediate stage of manufacture before, for instance, substrate 16 has been thinned back from the back side in order to expose TSVs 3.

Optical coupler 8 is in this embodiment formed in a top semiconductor layer 16''' of a Silicon On Insulator (SOI) wafer 16. As is known, SOI wafer 16 includes a bulk substrate 16', illustratively made of doped or undoped silicon or other semiconductor material, a buried oxide (BOX) layer 16'', typically but not necessarily made of silicon oxide, and a semiconductor layer 16''' on BOX layer 16''. Semiconductor layer 16''' can be doped or undoped (or selectively doped in various regions) silicon, silicon-germanium, gallium-arsenide, other III-V materials, and the like. Additionally, SOI wafer may also include a dielectric layer 18 on the "back side" (the "back side being the side opposite the "front side" where active devices and the like are formed). Dielectric layer 18 is generally a layer that is intentionally formed or deposited on the back side, but in contemplated embodiments, dielectric layer 18 could be a native oxide that naturally forms on the exposed surface of bulk substrate 16'.

As mentioned, grating coupler 8 is formed in semiconductor layer 16''' of substrate 16, in this case as a series of spaced features etched into a top surface of the layer. As is known, the number, size, and spacing of these features can be selected depending upon the wavelength(s) of the light signal being handled by optical IC 2. Also shown in FIG. 2A are other features formed in semiconductor layer 16''', which can include active and passive components including transistors, photonic transistors, light detectors, wave guides, and the like.

Interconnect 20, also referred to herein as interconnect structure 20, is formed above substrate 16 and the components formed thereon to provide for electrical interconnection between those components and also electrical to other components and circuits outside of optical IC 2. As will be appreciated, interconnect 20 can be formed using conventional materials, structures, and process as are known in the art. For instance, as in the illustrated embodiment, interconnect structure 20 may include conductive contacts 22 that electrically contact components formed in semiconductor layer 16''' and may further include one, two, or more levels of conductive features 24a, 24b, 24c and conductive vias 24d connecting various ones of the conductive features. While three levels of conductive features are shown, it will be appreciated that four or more, even eight or more levels are contemplated, depending upon the complexity of the circuit being manufactured. Each level of conductive features is embedded within a dielectric layer 26a, 26b, 26c, 26d, etc. Typically, different materials and/or deposition techniques will be employed to form at least two of the dielectric layers 26a, 26b, 26c, 26d, etc., and as a result the interface between different layers can affect optical transmission (such as causing reflection, refraction, or the like). Additionally, although each of layers 26a, 26b, 26c, 26d, etc. are illustrated as a single layer—it will also be appreciated that each of these layers often includes multiple layers, including one or more etch stop layers (ESLs) and one or more sub-layers of dielectric material. At a minimum, ESLs are typically a different material than the underlying (and/or overlying) material and hence these layers can also give rise to optical interference in light transmission path 10, particularly at the interfaces between respective layers.

It is for the above reason, as well as for other reason that may be associated with the device performance, the manufacturing processes, or both, that one or more (or all) of dielectric layers 26a, 26b, 26c, 26d, etc. is removed, leaving an opening 28 through which light path 10 may extend. In many embodiments, however, it may be undesirable to leave opening 28 unfilled (such issues may include one or more of uneven topography affecting subsequent process steps, the risk of environmental contamination entering the device through opening 28, subsequent deposition steps filling opening 28, the formation of an optical interface between any remaining dielectric layer(s) and the air above them, and the like). Hence, it is contemplated that in most (but not necessarily all) embodiments, opening will not remain unfilled, but will be filled with one or more dielectric materials. Examples are provided in the following embodiments.

Figure 2B:
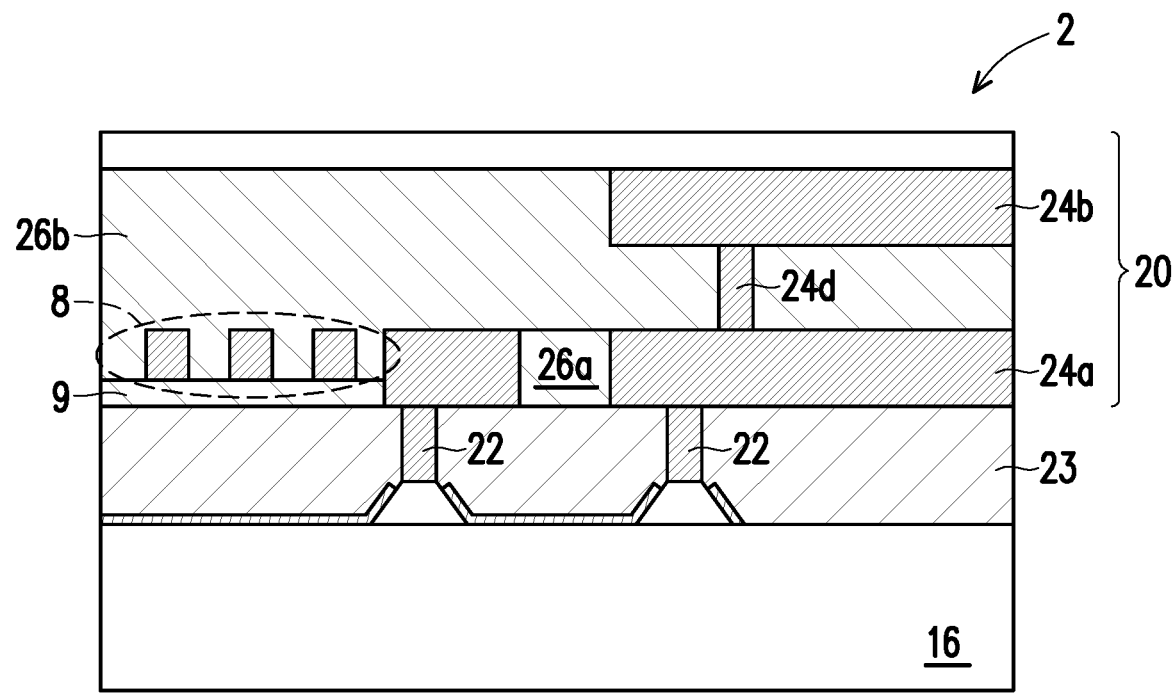

FIG. 2B illustrates another illustrative optical feature 8, also a grating coupler. In this instance, grating coupler 8 is not formed in the substrate 16, but rather is formed in a metal layer above the substrate. For instance, dielectric layer 23 can be formed on the substrate and contacts 22 formed therein. Then dielectric layer 26a can be formed on substrate 16 and patterned to include openings. Metal can then fill those openings, thus forming conductive features 24a in the first level of interconnect 20 simultaneously with forming grating coupler 8. While grating coupler 8 is shown as being in the first metal level of interconnect 20, the optical feature could just as well be formed in another level of the interconnect; likewise although two levels of interconnect are shown in FIG. 2B, a single level of conductive features, or three or more levels are within the contemplated scope of this embodiment as well. Furthermore, while certain advantages in cycle time, cost, and the like might arise from forming grating coupler 8 simultaneously with conductive features 24a, 24b, etc., this is optional and in some embodiments grating coupler 8 could be formed separately from other conductive features of interconnect 20. Additionally, prior to forming grating coupler 8, wave guide 9 can be formed by, e.g., depositing and then patterning an appropriate dielectric material.

Figure 2C:
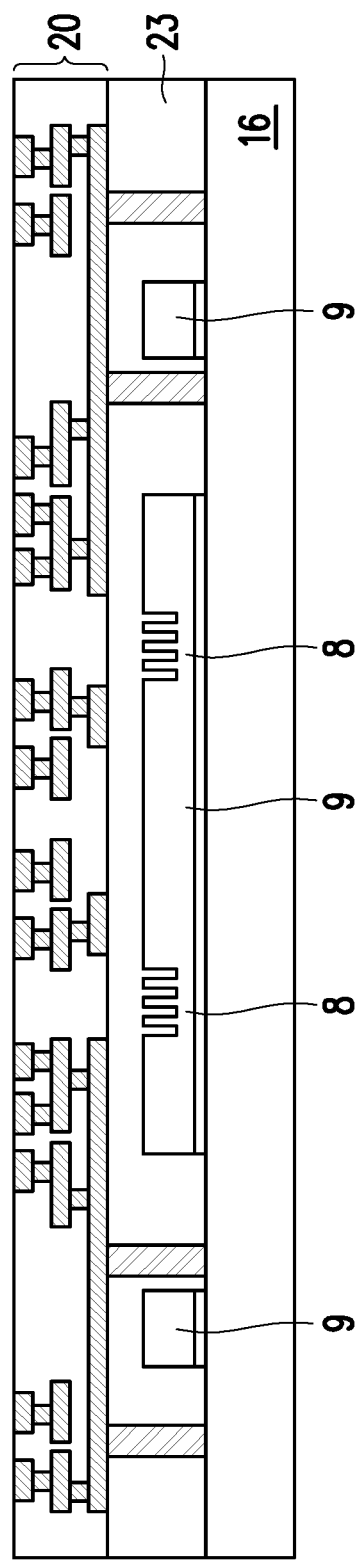

FIG. 2C represents yet another embodiment optical feature. In this embodiment, wave guides 9 are formed by etching patterns into a bulk semiconductor substrate 16 (or alternatively into a top semiconductor layer of an SOI substrate) and then grating couplers 8 can be etched into a top surface of (at least portions of) wave guides 9. Next, as with the previously described embodiments, one or more interconnect 20 levels are formed by forming respective conductive features 24a, 24b, etc. in one or more respective dielectric layers 26a, 26b, etc.

One skilled in the art will recognize numerous alternatives and variations to the above described processes and structures can be implemented and still remain within the contemplated scope of the present disclosure of an optical IC, having an optical feature therein, that forms a part of an integrated package.

Figure 3A:
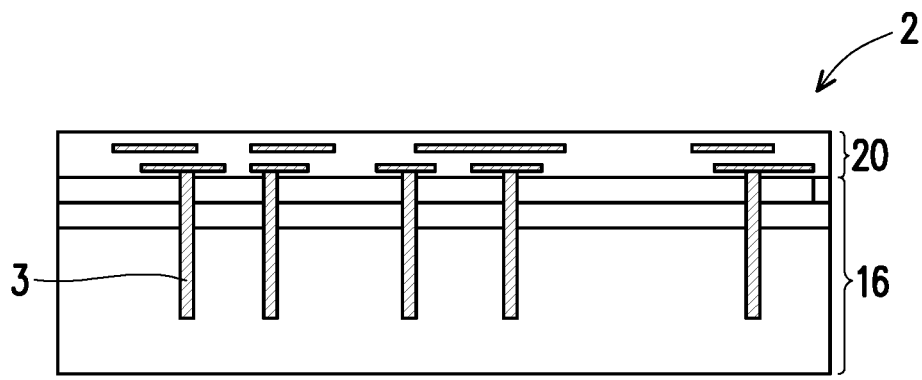
Figure 3B:
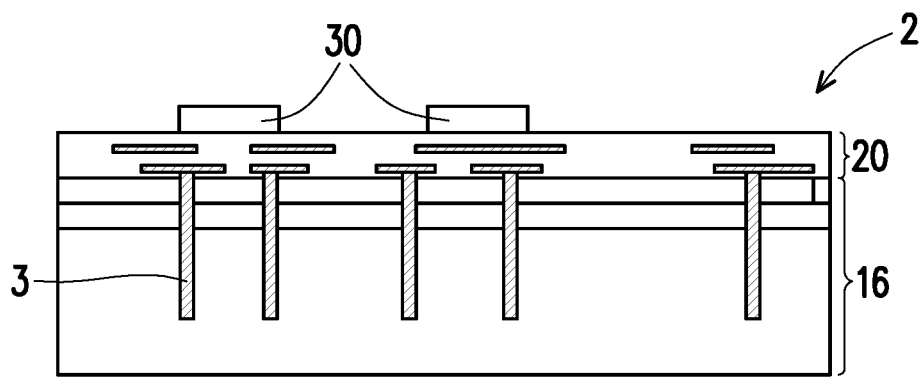

Referring back for a moment to FIG. 2A, a pad 30 is shown atop interconnect structure 20. This pad is typically employed for probing circuitry of optical IC 2, and/or for electrically connecting optical IC 2 to other components, through wire bonding, ball bonding, solder joints, flip-chip bonding, or the like. While not specifically illustrated, it is contemplated that other embodiments, including the embodiments illustrated in FIGS. 2B and 2C, would likewise have pads 30. FIG. 3A generically illustrates a optical IC 2 at an intermediate stage of manufacturing wherein optical features 8, 9 (not shown) have been formed, TSVs 3 have been formed, but substrate 16 has not yet been thinned back to expose them, and interconnect 20 has been formed, such as has been described with regard to one or more of FIGS. 2A through 2C. FIG. 3B illustrates this generic optical IC after bonding pads 30 are formed overlying interconnect structure 20. In the illustrated embodiment, bond pads 30 are formed of aluminum or an alloy of substantially aluminum. In other embodiments, however, bond pads 30 could be formed of any suitable conductive material such as copper, tungsten, gold, platinum, palladium, nickel, tin, or the like or alloys and combinations of the like. While only two bond pads 30 are illustrated for clarity and brevity, it should be clear that numerous bond pads will be formed. The bond pads are electrically connected to interconnect 20 and hence to one or more electrical components (not shown) such as transistors, capacitors, resistors, diodes, and the like formed within optical IC 2. In some embodiments, one or more bond pads 30 could be electrically coupled to one or more respective TSVs 3, through, e.g., interconnect structure.

Figure 4A:
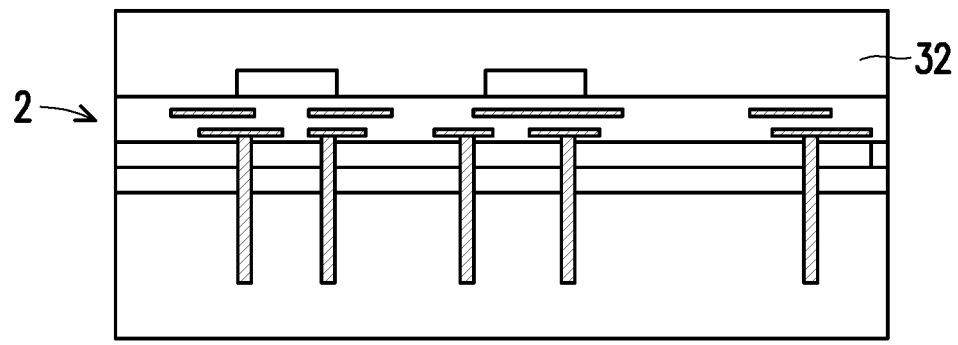
FIGS. 4A through 4G illustrated intermediate steps in the manufacture of a packaged device in accordance with some embodiments.
Figure 4B:
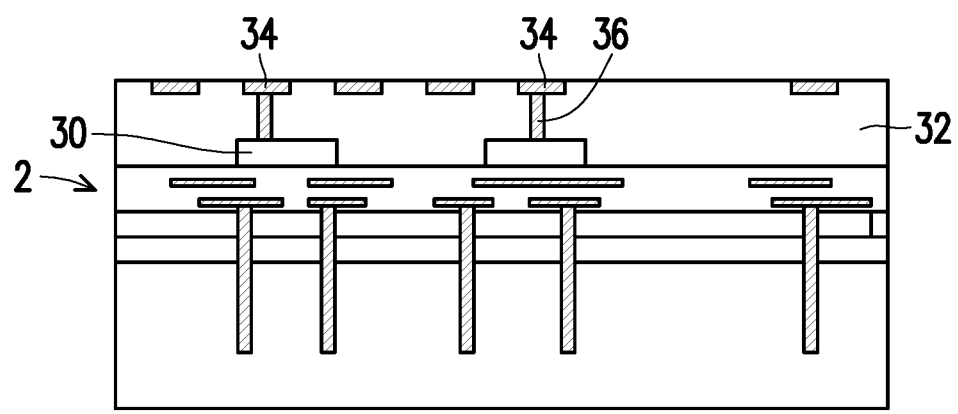

Continuing with the process, optical IC 2 is further processed for integration with an (or more than one) electronic IC 4 through, for instance, hybrid bonding. Beginning with FIG. 4A, a bonding dielectric layer 32 is formed over the structure illustrated in FIG. 3B. Bonding dielectric layer 32 is preferably an oxide, such as silicon oxide, silicon oxynitride, and the like. Alternatively, dielectric layer 32 could comprise silicon nitride, or some other dielectric with suitable electrical, chemical, and mechanical properties, as described below. Bonding dielectric layer 32 can be deposited using known techniques such as CVD, PECVD, spin-on glass, TEOS processes, and the like, to a thickness in the range of from about 2.0 μm to about 4.0 μm above the top bond pad 30 surface of optical IC 2.

Bond pads 34 and bond vias 36 are formed in bonding dielectric layer 32 using known patterning and deposition techniques. For instance, bonding dielectric layer 32 could be patterned using lithographic processes, resulting in holes and trenches formed therein, followed by deposition of one or more layers of conductive materials within the holes and trenches, using so-called damascene processing techniques. Alternatively, electro-plating, electro-less plating, sputtering, or other known techniques could be used to form bond pads 34 and bond vias 36. Regardless of the formation process, bond pads 34 and bond vias 36 provide an electrical connection to pads 30 for subsequent electrical connection to external circuits and devices as described more fully below. In some instances, the metal or other conductive material used to form bond pads 34 might extend above the top surface of bonding dielectric layer 32—in which case a planarization process such as Chemical Mechanical Polishing (CMP), etch back, or the like should be employed to ensure that respective top surfaces of bond pads 34 and bonding dielectric layer 32 are level and coplanar. These top surfaces form a bonding surface for optical IC 4.

Optionally, but preferably, a surface treatment is applied to the bonding surface of optical IC 4. The surface treatment may include a plasma treatment and/or an acid treatment. When the acid treatment is performed, the surface of bond pads 34 and bonding dielectric layer 32 are treated with an acid, which may include, for example, formic acid (HCOOH). Through the acid, metal oxide on the surfaces of bond pads 34, if any, may be removed. Some particles and undesirable substances (e.g., contamination, by-products of previous process steps, and the like) on the surface of bond pads 34 and bonding dielectric layer 32 may also be removed during the acid treatment.

The plasma treatment may be performed in a vacuum environment, such as a vacuum chamber of the same tool in which the acid treatment occurred. The process gas used for generating the plasma may include a first combined gas of hydrogen ($H_2$) and argon (Ar), a second combined gas of $H_2$ and nitrogen ($N_2$), or a third combined gas of $H_2$ and helium (He). In some exemplary embodiments, the flow rate ratio of $H_2$ in the first, the second, or the third combined gas, whichever is used in the plasma treatment, may be between about 4 percent and about 5 percent. The hydrogen helps reduce metal oxide on the surfaces of bond pads 34 back to metal. Furthermore, through the treatment, the number of OH groups at the surface of bonding dielectric layer 32 is increased, which is beneficial for forming strong fusion bonds. The plasma treatment may also be performed using pure or substantially pure $H_2$, Ar, or $N_2$, as the process gas, which treats the surfaces of bond pads 34 and bonding dielectric layer 32 through reduction and/or bombardment. The plasma used in the treatment may be a low-power plasma, with the power for generating the plasma between about 10 Watts and about 2,000 Watts. In the surface treatment, partially due to the low power, the surface roughness of bond pads 34 and bonding dielectric layer 34 are not appreciably changed compared to before the surface treatment, and may be maintained, for example, smaller than about 10 Å.

Preferably, but not necessarily, optical IC 2 is next subjected to a surface cleaning process. The surface clean may include De-Ionized (DI) water rinsing, with DI water being sprayed onto the surface of package component 100. Alternatively, the surface cleaning is performed using Ammonium Hydroxide ($NH_4OH$), or some other appropriate cleaning solution.

Figure 4C:
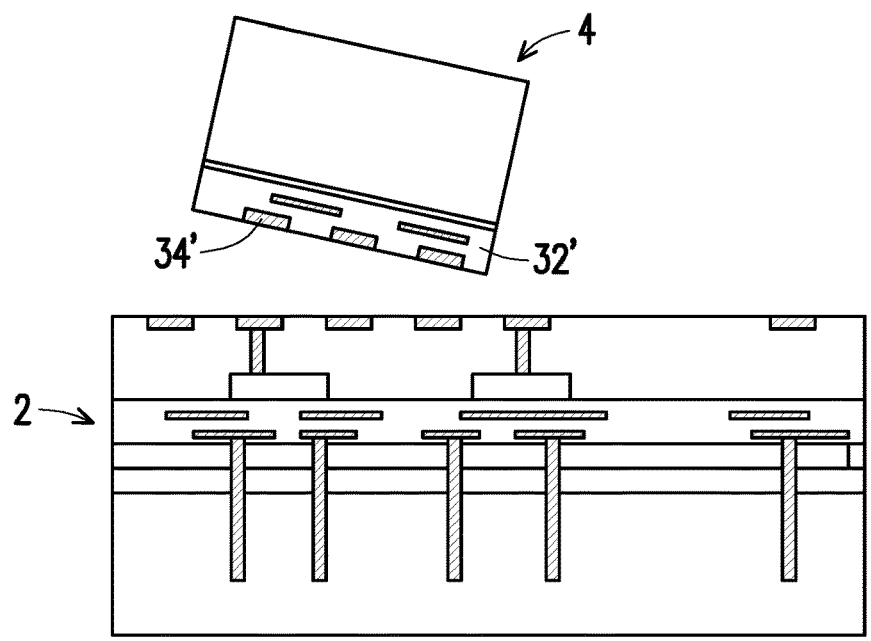

FIG. 4C schematically illustrates a pick and place operation whereby electronic IC 4 is positioned relative to optical IC 2. It should be appreciated that electronic IC 4 has been processed to likewise have a bonding surface comprised of bond pads 34' and bond dielectric layer 36'. Preferably, this bonding surface has also undergone similar, but not necessarily identical, surface treatment and surface cleaning processes as were performed on optical IC 2. In the pick and place operation, bond pads 34' of electronic IC 4 are aligned to corresponding bond pads 34 of optical IC 2 and bonding dielectric layer 32' of electronic IC 4 is positioned such that its major surface faces the corresponding major surface of bonding dielectric layer 32 of optical IC 2.

After being aligned, the ICs 2 and 4 are pressed against each other. A pin (not shown) may be used to press on one point of optical IC 2 (or alternatively one point of electronic IC 4) first, instead of pressing the IC through multiple points at the same time. Accordingly, any air between the ICs 2 and 4 will be squeezed out through the pressing of the pin.

Hybrid bonding may be employed to bond optical IC 2 and electronic IC 4 together. During the hybrid bonding, a pressing force may be applied to press ICs 2 and 4 against each other. A pressing force of less than about 5 Newton applied, e.g., to the respective centers of ICs 2 and 4 is contemplated as sufficient for a pre-bonding process, if employed. This may be performed at room temperature (for example, dose to about 21° C.), although higher temperatures may be used. The bonding time may be shorter than about 1 minute, for example. This hybrid bonding process results in bond pads 34 and 34' being bonded to each other through direct metal-to-metal bonding, and bonding dielectric layers 32 and 32' being bonded to each other through fusion bonding.

While the bond strength resulting from the hybrid bonding may be sufficient for many applications, it is contemplated that in some applications, additional bonding strength between the ICs is needed. The bonding strength of bonded ICs 2 and 4 may be achieved, if needed, though thermal compressive annealing, for example. In an illustrative example of thermal compressive annealing, a compressive force of perhaps between about 5 kilo-Newtons and about 350 kilo-Newtons is applied to press ICs 2 and 4 against each other, e.g., through hydraulic power or air pressure. During the thermal compressive annealing, the temperature may be increased to higher than about 200° C., and may be between about 300° C. and about 450° C., in order to anneal the bonds between bond pads 34 and 34'. The duration of the thermal compressive annealing may be between about 0.5 hours and about 4 hours. The thermal compressive annealing station 310 may be conducted in an inert atmosphere such hydrogen ($H_2$), nitrogen ($N_2$), or the like, to avoid oxidation of other chemical reactions to exposed surfaces during the process.

Figure 4D:
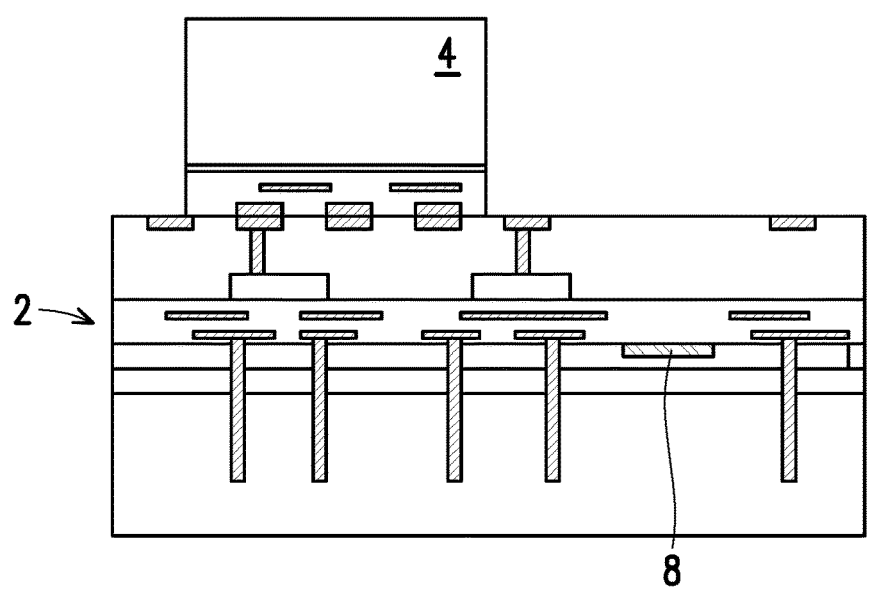

FIG. 4D illustrates the result of the bonding process (whether hybrid bonding alone, hybrid bonding in combination with thermal compressive annealing, or some other bonding scheme), whereby electronic IC 4 is physically and electrically connected to optical IC 2 through their respective bond surfaces including respective bond pads 34' and 34. Note that optical feature 8 as shown in FIG. 4D is not covered by electronic IC 4—this allows for an unobstructed optical path to optical feature 8 in the finished product, as will be further described in the following paragraphs.

Figure 4E:
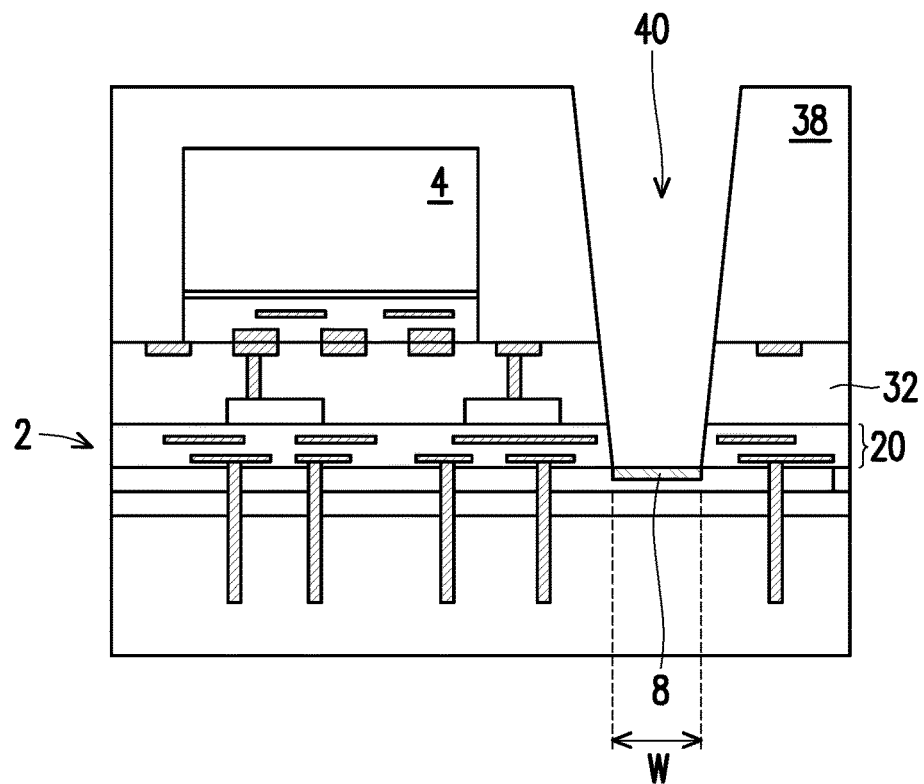

A masking layer 38 is formed atop the upper surfaces of optical IC 2 and electronic IC 4 as shown in FIG. 4E. This masking layer 38 is then patterned using known photolithographic processes (deposition of the material, exposure to light through a patterned mask or reticle, development, etc.) to form an opening 40 extending there through. The particular material employed for masking layer 38 is a matter of design choice. A commercially available photoresist material will suffice, as will any photo-sensitive polymer or other photo-sensitive material with sufficient resolution to form patterns of a desired size. As an example, opening 40 has a nominal size of about 20 μm in a currently contemplated embodiment. In other words, if opening 40 has a rectangular shape (when viewed from a layout view), then the length of the smallest side of the rectangle would be around 20 μm, whereas if opening 40 has a circular shape (in the layout view) then the nominal diameter of opening 40 is about 20 μm. This size is provided solely as an example and openings of much larger and much small nominal size are within the contemplated scope of this disclosure. One skilled in the art will readily recognize the type of materials suitable for masking layer 38 when informed by the present teaching.

Opening 40 is formed to align with optical feature 8 of optical IC 2. More precisely opening 40 is formed to coincide with an optical path 10 to be provided to optical feature 8. Opening 40 can be extended through bonding dielectric layer 32 and through interconnect 20 using a suitable etch process. For instance, a buffered oxide etch, including a buffering agent, such as ammonium fluoride (NH4F), and diluted hydrofluoric acid (HF), can be employed to remove silicon oxide layers in bonding dielectric layer 32 and interconnect 20, and possibly to remove thin silicon nitride layers in interconnect 20 as well. In other embodiments, silicon nitride layers could be etched using a separate etch process such as an etch bath of concentrated hot orthophosphoric acid ($H_3PO_4$) or the like. Either dry etch or wet etch process(es) could be employed, as could either an isotropic or an anisotropic etch. For process control, pattern density, and the like, it may be preferable to use an anisotropic etch to maintain the width/diameter of opening 40 as close as possible to the nominal designed value.

As shown, by selecting appropriate etch conditions and chemistries, the etching of opening 40 stops upon reaching optical feature 8, whether the optical feature is formed of metal, dielectric, substrate material, or combinations. In some embodiments, it may be desirable to include an appropriate etch stop layer (ESL) overlying optical feature 8 to ensure that no damage occurs to optical feature 8 during the formation of opening 40.

While opening 40 is shown as being substantially aligned with and coterminous with optical feature 8, in other embodiments opening 40 might expose only a portion of optical feature 8. In yet other embodiments, opening 40 might extend past the periphery of optical feature 8. For instance, a certain tolerance for misalignment could be built into the device if opening 40 is nominally larger in size than the size of optical feature 8.

It should be noted here that by forming opening 40 through interconnect 20, the interfaces between the various layers that comprise interconnect 20 are removed from what will become the optical path 10 (see FIG. 4F) for optical feature 8. These interfaces are sites for interference such as reflection and refraction and hence removing them from optical path 10 will improve the optical performance of the resulting device.

Figure 4F:
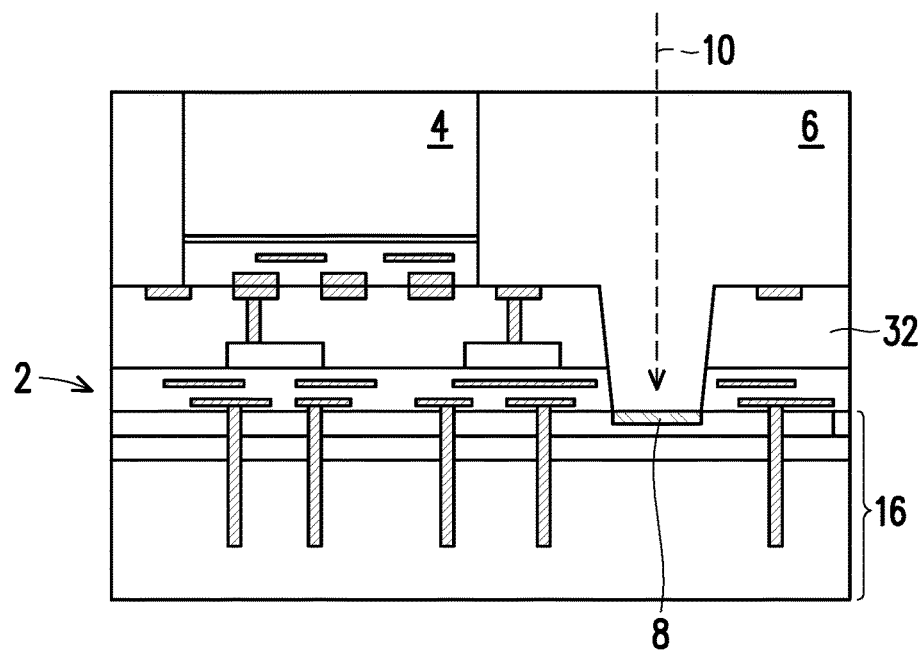

Continuing with FIG. 4F, protective dielectric material 6 is then deposited over the device, including within opening 40. Preferably, protective dielectric material 6 is chosen so that it is optically compatible with the wavelength(s) of light that will be transmitted to/received from optical feature 8. For most applications, silicon oxide is sufficiently transparent at the desired wavelengths and silicon oxide additionally provides the benefit of being a good insulator, compatible with most materials and processes used in conventional semiconductor processing, and relatively stable chemically and mechanically. A significant feature of the embodiment illustrated in FIG. 4F is that protective dielectric material 6 is effectively a single homogenous material having substantially uniform optical properties throughout the entirety of optical path 10 of which it forms a part. In this way, protective dielectric material does not impart substantial optical interference into the path—particularly reflections and refractions.

Figure 4G:
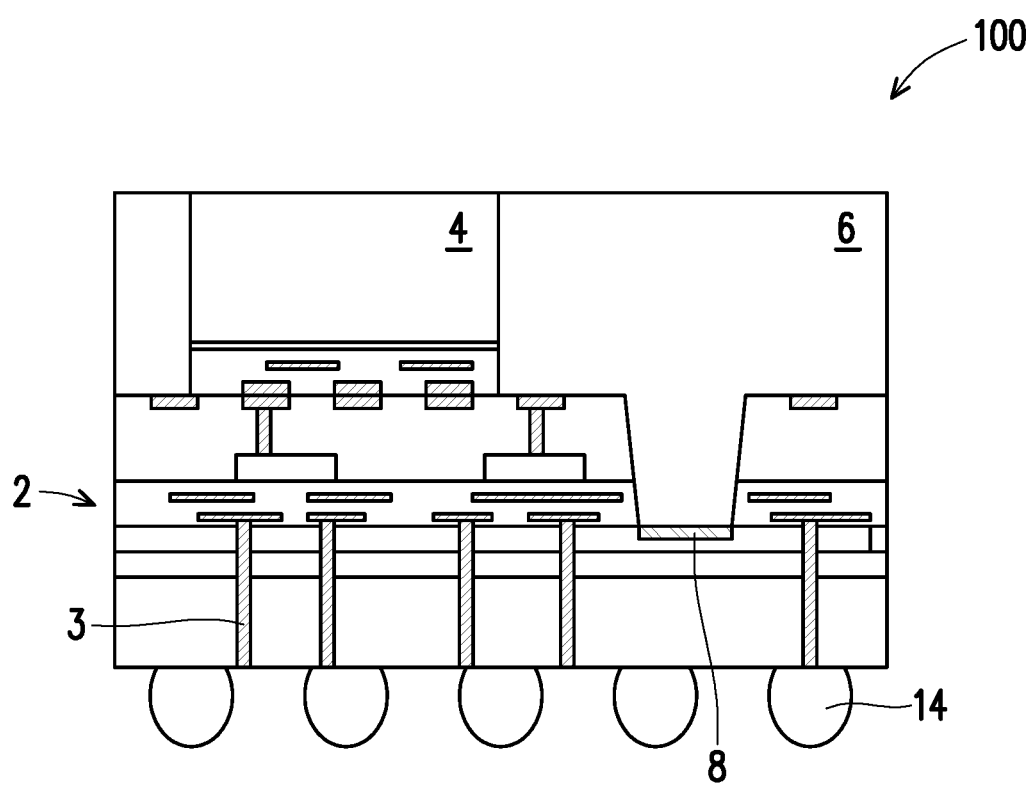

Additional processing steps may be employed to complete forming an integrated package 100. For instance, as shown in FIG. 4G, the back side of substrate 16 of optical IC 2 may be removed by grinding, polishing, etching back, or a combination of these and/or other techniques in order to thin the substrate and to expose the ends of TSVs 3. In this way, electrical connection can be made to TSVs 3 through, e.g., connectors 14. Device 100 may be further encapsulated or partially encapsulated in additional protective materials such as molding compound, protective polymer, and the like as will be apparent to those skilled in the art.

Figure 5A:
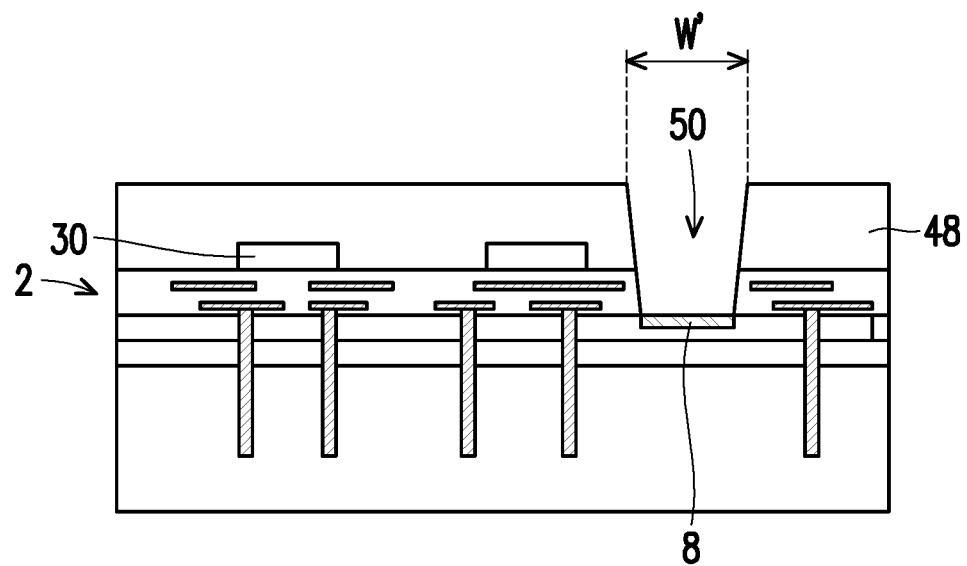
FIGS. 5A through 5F illustrated intermediate steps in the manufacture of a packaged device in accordance with other embodiments.

FIGS. 5A through 5F illustrate another embodiment for forming a device 100 including optical path 10. FIG. 5A illustrates a masking layer 48 having been formed over the structure illustrated in FIG. 3B. Masking layer 48 may be similar to masking layer 38 illustrated with respect to FIG. 4E, but with one key difference: masking layer 38 was formed after electronic IC 2 was bonded to optical IC 2, and hence had a much greater degree of topography to cover relative to masking layer 48. In other words, masking layer 38 is deposited cover both electronic IC 2 and optical IC 2 and hence has to be deposited to a great enough thickness to cover both. By contrast, masking layer 48 need only be deposited to a thickness sufficient to adequately over bond pads 32 on the bonding surface of optical IC 2. Theoretically, masking layer 38 need not be applied to a thickness to cover electronic IC 4 (as there is no patterning performed over electronic IC 4). As a practical matter, however, it would be difficult to ensure sufficient and uniform deposition and distribution of masking layer 38 over the structure illustrated in FIG. 4E without depositing to a thickness sufficient to cover electronic IC 4 as well as optical IC 2. Hence, the process illustrated in FIGS. 5A through 55 might offer increased flexibility in terms of the materials and processes used for forming and patterning masking layer 48.

As also shown in FIG. 5A masking layer 48 is patterned, preferably using conventionally available lithographic techniques to form an opening 50, and opening 50 is extended through the layers of interconnect 20 using conventional etch processes, as described above with reference to the embodiment of FIGS. 4A through 4F. In this way, inter-layer interfaces that might otherwise impede optical communication with optical feature 8 are removed.

Figure 5B:
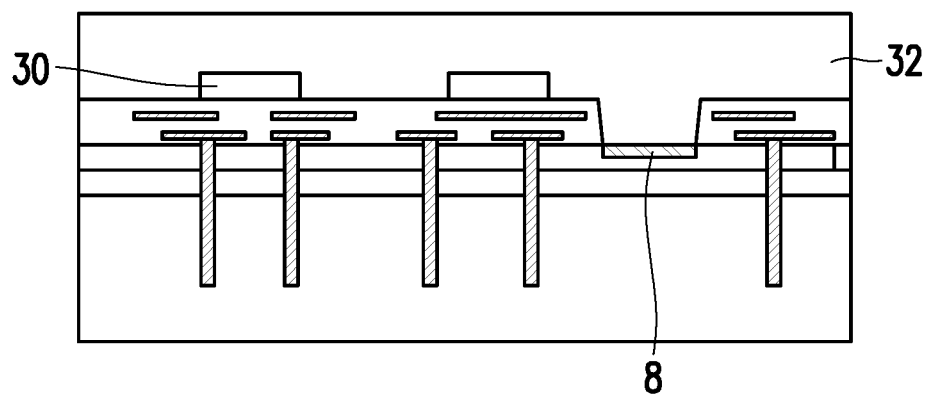
Figure 5C:
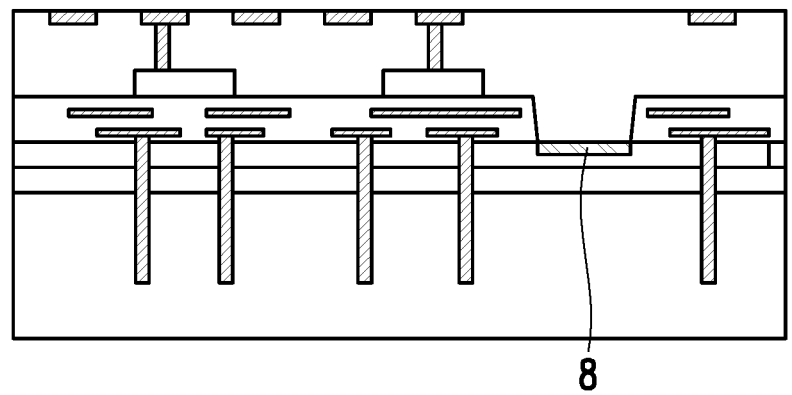
Figure 5D:
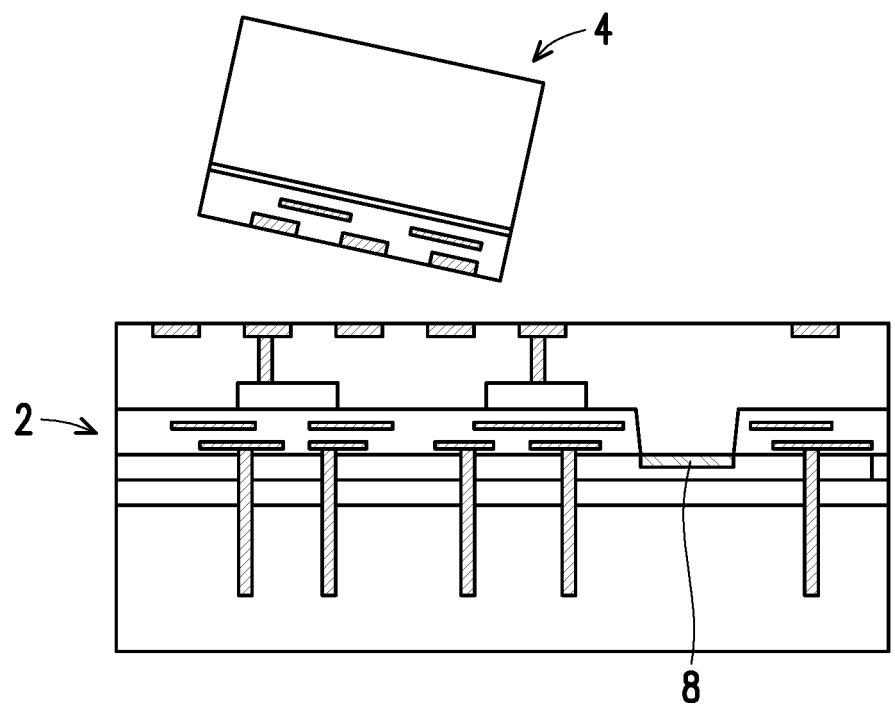
Figure 5E:
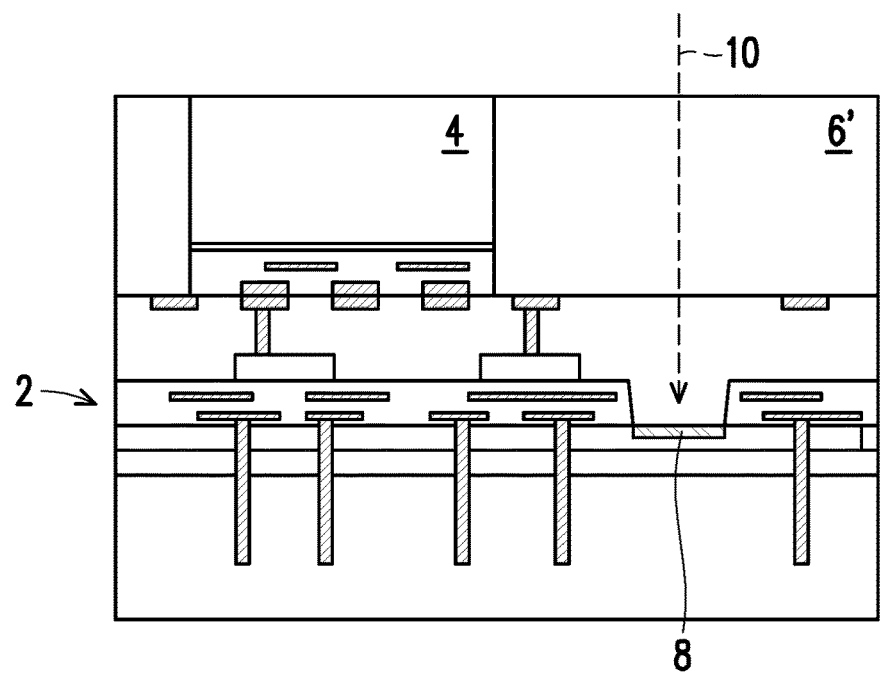

Next, masking layer 48 is removed and bonding dielectric layer 32 is deposited over interconnect 20 and pads 30, as shown by FIG. 5B. In this embodiment, bonding dielectric layer 32 is deposited after opening 50 has been formed in interconnect 20 and hence bonding dielectric layer 32 fills opening 50 and overlies optical feature 8. As shown in FIG. 5C, processing continues with the formation of bond pads 34 and bond vias 36 embedded within bonding dielectric layer 32, substantially as described above with regard to the embodiment illustrated in FIG. 4B. Similarly, a corresponding bonding dielectric layer 32', bond pads 34' and bond vias 36' may likewise be formed on electronic IC 4, as also described above, in this embodiment as well. Some or all of the above described pre-surface treatments may also be applied to optical IC 2, to electronic IC 4, or both and, as shown in FIG. 5D, electronic IC 4 is positioned relative to and aligned with optical IC 2 in this embodiment as well.

As illustrated in Figure SE, optical IC 2 and electronic IC 4 are bonded together. Details of various embodiments for bonding the ICs were provided above with respect to the embodiment of FIGS. 4A through 4F and for the sake of clarity and brevity are not repeated here. Also shown in Figure SE is protective dielectric material 6'. Protective dielectric material 6' can be formed of the same material and processes as described above with respect to protective dielectric material 6 illustrated in FIG. 4F. A difference between protective dielectric material 6 and protective dielectric material 6', however, is that while protective dielectric material 6 extends down to optical feature 8 (see FIG. 4F), the presence of bonding dielectric layer 32 in opening 50 means that protective dielectric material 6' does not extend down to optical feature 8 of FIG. 5E Rather, as shown, protective dielectric material 6' is formed on the top surface of bonding dielectric material 32 in this embodiment. As such, an interface exists between protective dielectric material 6' and bonding dielectric material 32 in this embodiment. For this reason, it is advantageous that protective dielectric material 6' and bonding dielectric material 32 both be formed of the same material and nominally even more advantageous that they both be formed using the same deposition process. In this way, the interface between protective dielectric material 6' and bonding dielectric material 32 will have minimal or perhaps no impact on the transmission of optical signals through optical path 10. In other embodiments, different deposition processes and different materials could be employed in forming protective dielectric material 6' and bonding dielectric material 32, but care should be taken to choose processes and materials to make the interface as optically inert as possible.

Figure 5F:
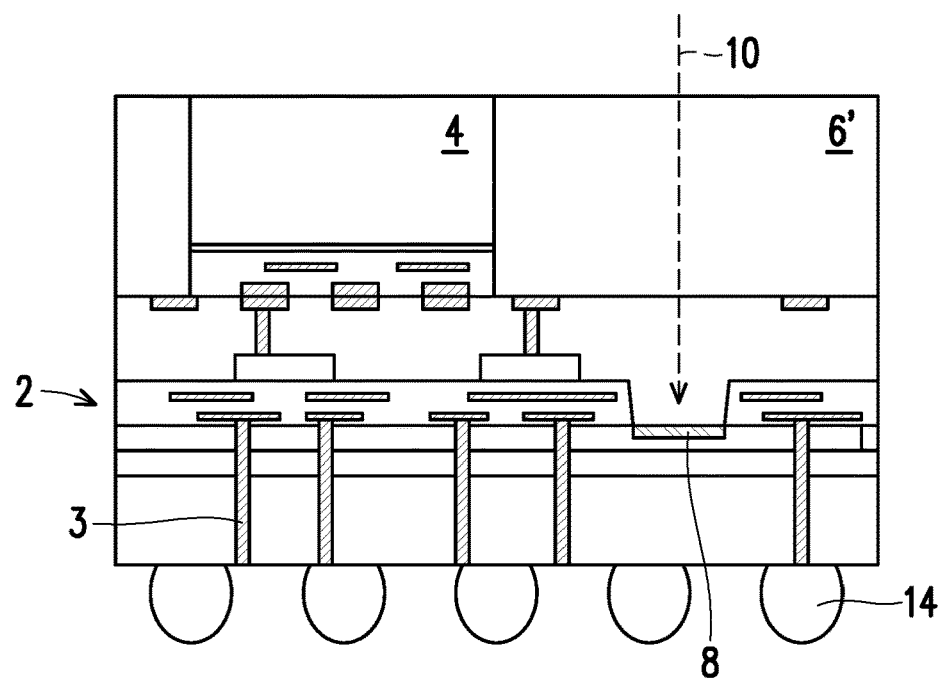

Finally, similarly to the processes illustrated in FIG. 4G, additional processing can be performed to complete the structure, as shown in FIG. 5F. These processes may include thinning substrate 16 of optical IC 2 to expose TSVs 3, forming electrical connectors 14 thereto, etc., the details of which have been addressed above and are not repeated here.

Figure 6A:
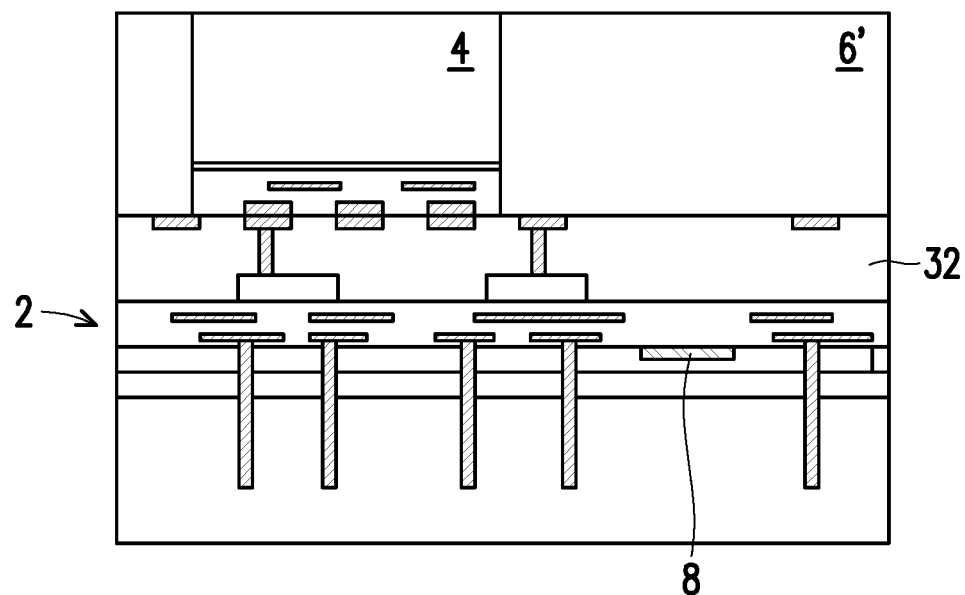
FIGS. 6A through 6D illustrated intermediate steps in the manufacture of a packaged device in accordance with additional embodiments.

FIGS. 6A through 6D represent yet another embodiment process for forming the device 100 illustrated in FIG. 1. FIG. 6A illustrates device 100 at the same stage of manufacture as illustrated by FIG. 4D, but with the addition of protective dielectric material 6' formed thereover. Similarly to protective dielectric material 6' of FIG. 5F, protective dielectric material 6' is formed before interconnect structure 20 is patterned and hence protective dielectric material 6' does not extend down to optical feature 8 but rather extends down only to the top surface of bonding dielectric material 32. In this embodiment, unlike the previously described embodiments, both bonding dielectric material 32 and protective dielectric material 6' are formed before interconnect structure 20 is patterned.

Figure 6B:
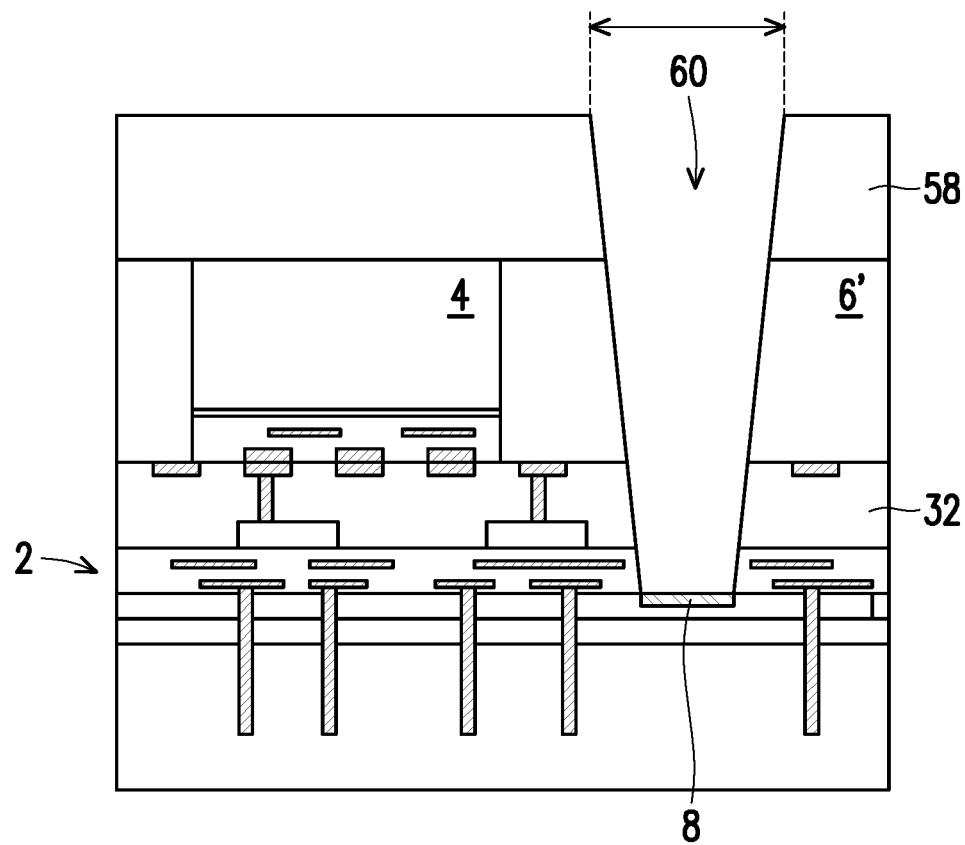

FIG. 6B illustrates the patterning of protective dielectric material 6', of bonding dielectric material 32, and of interconnect structure 20 using a patterned masking layer 58. Masking layer 58 can be a similar material patterned in a similar manner as described above with reference to masking layer 38 and/or masking layer 48. Likewise, assuming similar materials are used, protective dielectric material 6' and dielectric material 32 can be etched using processes similar to those described above, resulting in opening 60 extending to and exposing optical feature 8. In some embodiments, a remnant of dielectric material may remain over optical feature 8 even after opening 60 (or opening 50 or opening 40) is formed.

Figure 6C:
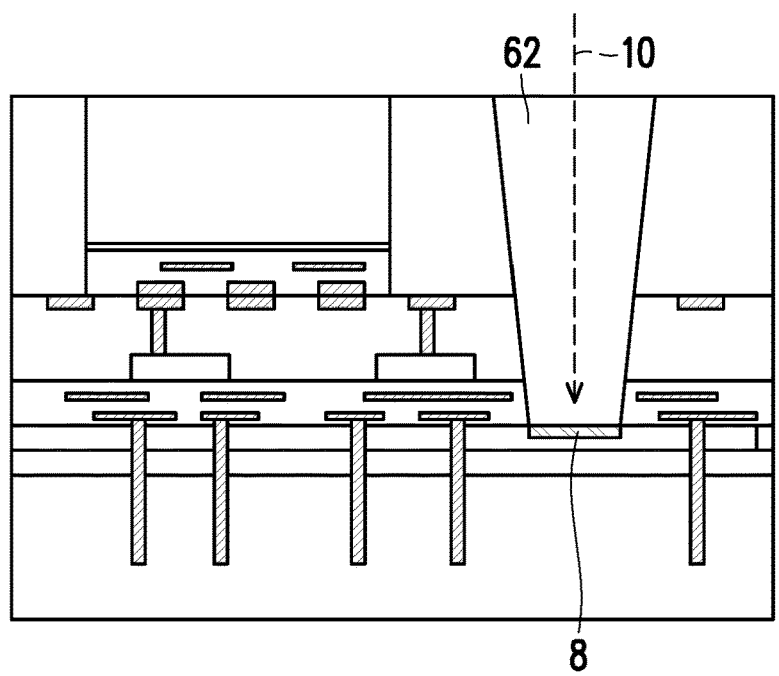
Figure 6D:
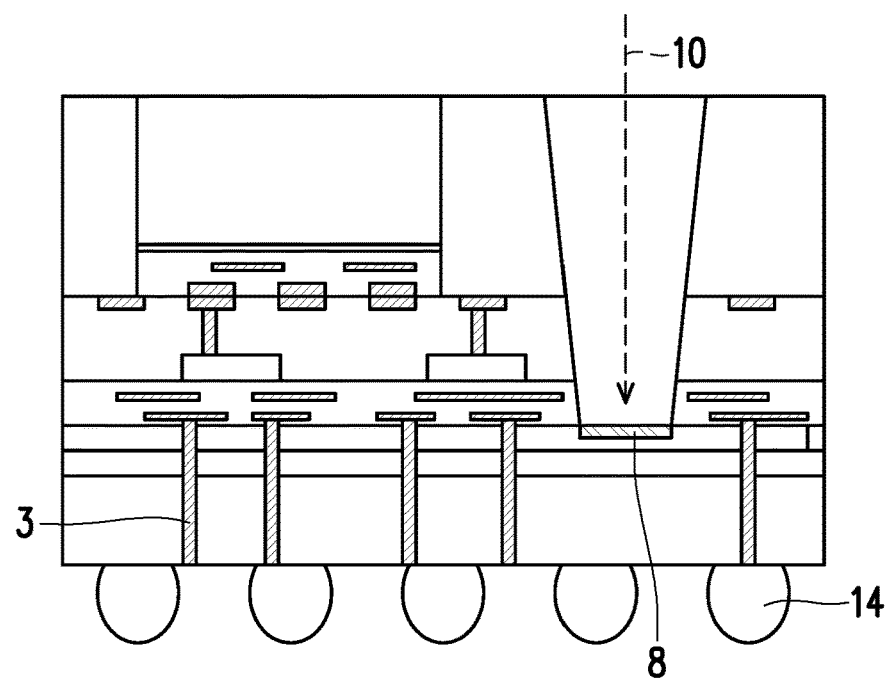

FIG. 6C illustrates the results of filling opening 60 with an optically appropriate fill material 62, such as an oxide, oxy-nitride, or the like. The oxide deposition process commonly referred to as TEO (named for the precursor material of tetraethyl orthosilicate, sometimes referred to as tetraethoxysilane) may be a particularly advantageous process for forming a silicon dioxide fill material 62. Note that the entire optical path 10 of this embodiment passes through only fill material 62—and does not pass through protective dielectric material 6' or bonding dielectric material 32. Hence, greater flexibility is allowed in selecting the materials and combinations of materials for protective dielectric material 6' and bonding dielectric material 32 because the interface between these materials does not lie in optical path 10 and hence will not cause any unwanted optical interference. Further processing of device, consistent with the description of FIG. 4G for instance, may be performed as illustrated by FIG. 6D.

Hence, in the above described embodiments, devices such as photonic ICs and electronic ICs can be tightly integrated into a 3D-IC type package with robust fan-out interconnects between them and protective layers encapsulating them without introducing interference into the optical path by which light signals are transmitted to or from an optical feature, such as a grating coupler or the like, within the photonic IC.

It should be noted that in some embodiments, optical IC 2 or electronic IC 4, or both, do not use a separate bonding pad scheme—but rather use pads 30 and an appropriate dielectric layer surrounding pads 30 as the bonding surfaces.

Figure 7:
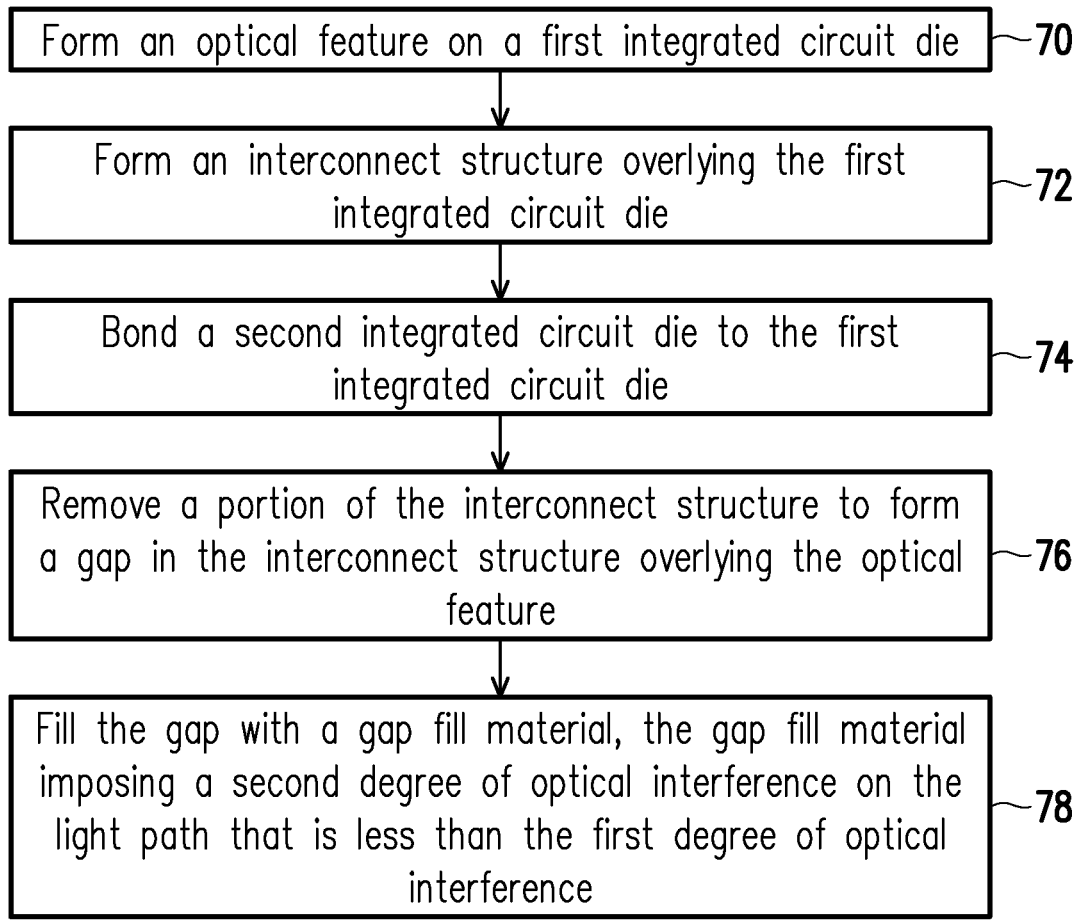
FIG. 7 illustrates in flow chart format an illustrative method.

FIG. 7 is a flow chart illustrating aspects of an illustrative method of forming device 100. The method starts with step 70, forming an optical feature on a first integrated circuit die. One example is optical feature 8 formed on optical IC 2. Then in step 72, the method continues with forming an interconnect structure overlying the first integrated circuit die. Interconnect structure 20 formed on optical IC 2, as described above, is an example. Typically, interconnect structure 20 includes a plurality of stacked materials which impose a first degree of optical interference on a light path extending to the optical feature. In a next step 74, the method continues with bonding a second integrated circuit die to the first integrated circuit die. This step could include hybrid bonding, thermos-compression bonding, and the like. A portion of the interconnect structure is removed to form a gap in the interconnect structure overlying the optical feature, per step 76. The is filled with a gap fill material, which imposes a second degree of optical interference on the light path that is less than the first degree of optical interference, as illustrated in step 78.

Although the above embodiments illustrate hybrid bonding a single optical IC 2 to a single electronic IC 4, it is within the contemplated scope of the present disclosure that wafer to wafer bonding could also be employed. As but one example, the illustrated optical IC 2 could be one of many photonic ICs that are manufactured simultaneously as parts of a larger wafer, as is known in the semiconductor arts. Optical IC 2 illustrated as a single IC after it has been singulated (diced) from the wafer. In other embodiments, however, a plurality of electronic ICs 4 could be mounted to and bonded to a wafer containing a plurality of respective photonic ICs 2 in their pre-singulated stated. After the bonding process, the wafer containing the photonic ICs could then be singulated. Depending upon the application and upon the respective sizes of the electronic ICs versus the photonic ICs, two or more electronic ICs 4 could be bonded to each optical IC 2. Alternatively, two or more photonic ICs 2 could be bonded to each electronic IC 4, if appropriate for the particular application.

Furthermore, while hybrid bonding is the presently contemplated most advantageous bonding method, it is within the scope of the present disclosure that other bonding techniques, including heat, pressure, fusion, or chemical bonding, with or without a separate adhesive layer, could be employed as well.

One general aspect of embodiments described herein includes a method. The method includes forming an optical feature on a first integrated circuit die. The method also includes forming an interconnect structure overlying the first integrated circuit die, the interconnect structure including a plurality of stacked materials, where the interconnect structure imposes a first degree of optical interference on a light path extending to the optical feature. The method also includes bonding a second integrated circuit die to the first integrated circuit die. The method also includes removing a portion of the interconnect structure to thereby form a gap in the interconnect structure overlying the optical feature. The method also includes and filling the gap with a gap fill material, the gap fill material imposing a second degree of optical interference on the light path that is less than the first degree of optical interference.

Another general aspect of embodiments described herein includes a method including forming an optical feature on a first integrated circuit die. The method also includes forming an interconnect structure overlying the first integrated circuit die, the interconnect structure including a plurality of stacked dielectric layer where optical interfaces exist between respective ones of the stacked dielectric layers. The method also includes bonding a second integrated circuit die to the first integrated circuit die. The method also includes forming a gap overlying the optical feature by removing a portion of the interconnect structure overlying the optical feature. The method also includes and filling the gap with a gap fill material, the gap fill material having no optical interfaces to a height, from the optical feature, at least as high as the topmost surface of the interconnect structure.

Yet another general aspect of embodiments described herein includes a device having an optical integrated circuit, which includes a silicon on insulator substrate. The device also includes a through substrate via (TSV) extending through a back side of the substrate, and an optical feature formed at a top side of the substrate. The device also includes and an interconnect structure formed over the top side of the substrate, the interconnect structure providing electrical connection to electrical components of the optical integrated circuit. The device further includes an electronic integrated circuit bonded to the optical integrated circuit by way of a bond interface. The bond interface includes a first dielectric layer fusion bonded to a second dielectric layer and a first metal pad metal-to-metal bonded to a second metal pad. The device also includes and an optical path aligned to the optical feature, the optical path extending to a topmost surface of the device. A portion of the optical path extends through the interconnect structure and through the first dielectric layer is free of optical interfaces.

Aspects of embodiments disclosed herein include an optical integrated circuit including a silicon on insulator substrate. The device also includes a through substrate via (TSV) extending through a back side of the silicon on insulator substrate. The device also includes an optical feature formed at a top side of the substrate. The device also includes and an interconnect structure formed over the top side of the substrate, the interconnect structure providing electrical connection to electrical components of the optical integrated circuit. The device also includes an electronic integrated circuit bonded to the optical integrated circuit by way of a bond interface, the bond interface including a first dielectric layer fusion bonded to a second dielectric layer and a first metal pad metal-to-metal bonded to a second metal pad. The device also includes an optical path structure aligned to the optical feature, the optical path structure may include a dielectric material extending to a topmost surface of the device, an integral portion of the optical path structure extending through the interconnect structure and through the first dielectric layer, and being free of optical interfaces from a top surface of the first dielectric layer to the bottom surface to the interconnect structure.

Other aspects of embodiments disclosed herein include an optical integrated circuit including a substrate, and an optical feature formed at a top side of the substrate. The device also includes an interconnect structure formed over the top side of the substrate, the interconnect structure including a first bonding dielectric layer and first bonding pads embedded within and co-planar with the first bonding dielectric layer. The device also includes an electronic integrated circuit including a second bonding dielectric layer, the second bonding dielectric layer forming a fusion bond interface with the first bonding dielectric layer, and second bonding pads embedded within and co-planar with the second bonding dielectric layer, respective second bonding pads forming respective metal-to-metal interfaces with respective first bonding pads, an optical path structure aligned to the optical feature. The optical path structure may include a dielectric material extending from at least a topmost surface of the second bonding dielectric layer to a at least a bottommost surface of the first bonding dielectric layer, the optical path being free of optical interfaces from a top surface of the first bonding dielectric layer to the bottommost surface to the interconnect structure.

In other aspects, embodiments disclosed herein provide for an optical integrated circuit having an optical feature on a top surface thereof a first bonding dielectric layer on the top surface. The device also includes first metal bonding pads embedded in and co-planar with the first bonding dielectric layer. The device also includes an electronic integrated circuit on the optical integrated circuit, the electronic integrated circuit including a second bonding dielectric layer forming a fusion bond interface with the first bonding dielectric layer, and second metal bonding pads embedded in and co-planar with the second bonding dielectric layer, respective second metal bonding pads forming respective metal-to-metal interfaces with respective first metal bonding pads. The device also includes and an optical path structure extending from a topmost surface of the electronic integrated circuit through to the optical feature, the optical path structure defined at least in part by a pathway dielectric material that extends above the fusion bond interface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
an optical integrated circuit including:
    a silicon on insulator substrate;
    a through substrate via (TSV) extending through a back side of the silicon on the insulator substrate;
    an optical feature formed at a top side of the substrate; and
    an interconnect structure formed over the top side of the substrate, the interconnect structure providing electrical connection to electrical components of the optical integrated circuit;
an electronic integrated circuit bonded to the optical integrated circuit by way of a bond interface, the bond interface including a first dielectric layer fusion bonded to a second dielectric layer and a first metal pad metal-to-metal bonded to a second metal pad; and
an optical path structure aligned to the optical feature, the optical path structure comprising a dielectric material that surrounds the electronic integrated circuit, the dielectric material extending to a topmost surface of the device, an integral portion of the optical path structure extending through the interconnect structure and through the first dielectric layer, and being free of optical interfaces from a top surface of the first dielectric layer to a bottom surface of the interconnect structure.

2. The device of claim 1, wherein the optical path structure is free of optical interfaces along its length from the optical feature to the topmost surface of the device.

3. The device of claim 1, wherein the optical path structure includes one optical interface substantially aligned with the bonding interface.

4. The device of claim 1, wherein the optical path structure extends from a top surface of the electronic integrated circuit to the optical feature and consists of a single protective dielectric layer.

5. The device of claim 1, wherein the optical path structure further comprises a portion of the first dielectric layer.

6. The device of claim 5, wherein the dielectric material and the first dielectric layer comprises the same material.

7. The device of claim 6, wherein the dielectric material and the first dielectric layer comprise silicon oxide.

8. The device of claim 1, wherein the optical path structure passes through a fusion bond interface between the first dielectric layer and the second dielectric layer.

9. A device comprising:
an optical integrated circuit including a substrate, and an optical feature formed at a top side of the substrate;
an interconnect structure formed over the top side of the substrate, the interconnect structure including a first bonding dielectric layer and first bonding pads embedded within and co-planar with the first bonding dielectric layer;
an electronic integrated circuit including a second bonding dielectric layer, the second bonding dielectric layer forming a fusion bond interface with the first bonding dielectric layer, and second bonding pads embedded within and co-planar with the second bonding dielectric layer, respective second bonding pads forming respective metal-to-metal interfaces with respective first bonding pads; and
an optical path structure aligned to the optical feature, the optical path structure comprising dielectric material that surrounds the electronic integrated circuit and that is transparent to a desired wavelength of light, the optical path structure being free of optical interfaces from a top surface of the first bonding dielectric layer to the bottommost surface of the interconnect structure.

10. The device of claim 9, further comprising:
a through substrate via (TSV) extending through the substrate; and
an external connector physically contacting the TSV.

11. The device of claim 9, wherein the optical path structure is a single dielectric material extending from a topmost surface of the device to the optical feature.

12. The device of claim 9, wherein the optical path structure includes the dielectric material surrounding the electronic integrate circuit and further includes a portion of the first bonding dielectric layer.

13. The device of claim 12, wherein the dielectric material surrounding the electronic integrated circuit and the first bonding dielectric layer comprise the same material.

14. The device of claim 9, wherein the optical path structure comprises at least two dielectric materials, the first dielectric material being the first dielectric bonding layer and the second material being a protective dielectric overlying the first bonding dielectric layer.

15. The device of claim 9, wherein the dielectric material comprises silicon oxide.

16. A device comprising:
an optical integrated circuit having an optical feature on a top surface thereof;
a first bonding dielectric layer on the top surface of the optical integrated circuit;
first metal bonding pads embedded in and co-planar with the first bonding dielectric layer;
an electronic integrated circuit on the optical integrated circuit, the electronic integrated circuit including
a second bonding dielectric layer forming a fusion bond interface with the first bonding dielectric layer, and
second metal bonding pads embedded in and co-planar with the second bonding dielectric layer, respective second metal bonding pads forming respective metal-to-metal interfaces with respective first metal bonding pads; and
an optical path structure extending from a topmost surface of the electronic integrated circuit through to the optical feature, the optical path structure defined at least in part by a pathway dielectric material that extends above the fusion bond interface and that is surrounded by and forms an interface with a passivation layer, the passivation layer further surrounding the electronic integrated circuit.

17. The device of claim 16, wherein the optical path structure comprises silicon oxide.

18. The device of claim 16, wherein the optical path structure comprises the same material as the passivation layer.

19. The device of claim 16, wherein the pathway dielectric material has sidewalls that slope outwards as the pathway dielectric material extends away from the optical feature.

20. The device of claim 16, wherein the first bonding dielectric layer is formed of a same material as the pathway dielectric material.

* * * * *